United States Patent [19]
McDaniel et al.

[11] Patent Number: 6,040,592
[45] Date of Patent: *Mar. 21, 2000

[54] WELL TO SUBSTRATE PHOTODIODE FOR USE IN A CMOS SENSOR ON A SALICIDE PROCESS

[75] Inventors: Bart McDaniel, Phoenix; Mark A. Beiley, Chandler; Lawrence T. Clark, Phoenix; Eric J. Hoffman; Edward J. Bawolek, both of Chandler, all of Ariz.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/873,987

[22] Filed: Jun. 12, 1997

[51] Int. Cl.[7] ................ H01L 31/068; H01L 31/0352
[52] U.S. Cl. .................... 257/292; 257/291; 257/443; 257/465
[58] Field of Search ................... 257/291, 292, 257/436, 443, 465, 461

[56] References Cited

U.S. PATENT DOCUMENTS

| | | | |
|---|---|---|---|
| 4,584,608 | 4/1986 | Soneda et al. | 257/292 |
| 4,611,223 | 9/1986 | Hine | 257/291 |
| 4,663,191 | 5/1987 | Choi et al. . | |
| 5,243,215 | 9/1993 | Enomoto | 257/443 |

OTHER PUBLICATIONS

"A High Performance 0.25 μm Logic Technology Optimized for 1.8V Operation," M. Bohr, S.S. Ahmed, S.U. Ahmen, M Bost, T. Ghani, J. Greason, R. Hainsey, C. Jan, P. Packan, S. Sivakumar, S. Thompson, J. Tsai, S. Yang, IEEE (1996), pp. 847–850.

"Progress in CMOS Active Pixel Image Sensors," Sunetra K. mendis, Sabrina E. Kemeny, Russell C. Gee, Bedabrata Pain, Quiesup Kim and Eric R. Fossum, SPIE, vol. 2172, pp. 19–29.

"Session 11 Overview: Electronic Imaging Circuits," Charles Stancampiano and Woodward Yang, Digest of Technical Papers, 1996 IEEE International Solid–State Circuits Conference, pp. 177–190.

"256×256 CMOS Active Pixel Sensor Camera–on–a–Chip," R.H. Nixon, S.E. Kemeny, C.O. Staller, E.R. Fossum, Digest of Technical Papers, 1996 IEEE International Solid–State Circuits Conference, p. 179.

"A 128×128–Pixel Standard–CMOS Image Sensor with Electronic Shutter," C.H. Aw, and B.A. Wooley, Digest of Technical Papers, 1996 IEEE International Solid–State Circuits Conference, pp. 180–181.

"360×360–Element Very–High Frame–Rate Burst–Image Sensor," W.F. Kosonocky, G. Yang, C. Ye, R.K. Kabra, L. Xie, J.L. Lawrence, V. Mastrocolla, F.V. Shallcross, V. Patel, Digest of Technical Papers, 1996 IEEE International Solid–State Circuits Conference, pp. 182–183.

(List continued on next page.)

Primary Examiner—Jerome Jackson, Jr.
Attorney, Agent, or Firm—Blakely, Sokoloff, Taylor & Zafman LLP

[57] ABSTRACT

An image sensor having a well-to-substrate diode as the photodetector. In a preferred embodiment, a modern salicided (CMOS) process is utilized to manufacture the image sensor. The field oxide region above the diode junction is transparent to visible light, thus allowing the photodiode competitive quantum efficiency as compared to devices having source/drain diffusion-to-substrate photodiodes fabricated on a non-salicided process. The photodiode can be integrated as part of a sensor array with digital circuitry using a relatively unmodified digital CMOS process. Furthermore, the structure allows the optical properties of the photodiode to be engineered by modifying the well without deleterious effects, to approximate a first order, on the characteristics of a FET built in another identical well.

23 Claims, 8 Drawing Sheets

OTHER PUBLICATIONS

"A 1/4 inch 330k Square Pixel Progressive–Scan IT–CCD Image Sensor with Sub–Micrometer Channel Width," T. Kuroda, Y. Matsuda, K. Ishikawa, K. Tachikawa, M. Masuyama, M. Asaumi, M. Niwayama, T. Yamada, Y. Miyata, N. Niisoe, S. Terakawa, Digest of Technical Papers, 1996 IEEE International Solid–State Circuits Conference, pp. 184–185.

"A CMOS Front–End for CCD Cameras," C. Mangelsdorf, K. Nakamura, S. Ho, T. Brooks, K. Nishio, H. Matsumoto, Digest of Technical Papers, 1996 IEEE International Solid–State Circuits Conference, pp. 186–187.

"A 9b Charge–to–Digital Converter for Integrated Image Sensors," S.A. Paul, H. Lee, Digest of Technical Papers, 1996 IEEE International Solid–State Circuits Conference, pp. 188–189.

"A 2.7in 1.3MPixel Driver–Integrated Poly–Si TFT–LCD for Multimedia Projectors," H. Asada, K. Hirata, K. Ozawa, K. Nakamura, H. Tanabe, K. Sera, K. Hamada, K. Mochizuki, S. Ohi, S. Saitoh, F. Okumura, S. Kaneko, Digest of Technical Papers, 1996 IEEE International Solid–State Circuits Conference, p. 190.

Wong, Hon–Sum Philip, Senior Member, IEEE, Chang, Richard T., Crabbé, Emmanuel, and Agnello, Paul D.; "CMOS Active Pixel Image Sensors Fabricated Using a 1.8–V, 0.25–$\mu$m CMOS Technology"; *IEEE Transactions on Electron Devices*, vol. 45, No. 4, Apr. 1998, pp. 889–894.

Forbes *IBM TDB* vol. 15 No. 4 Sep. 1972 "Photodiode . . . Sensitivity".-

WELL TO SUBSTRATE PHOTODIODE FOR USE IN A CMOS SENSOR ON A SALICIDE PROCESS

BACKGROUND

This invention is generally related to photodetecting semiconductor structures, and more specifically to photodiodes built using modern state of the art Complementary Metal Oxide Semiconductor (CMOS) fabrication processes.

Figure 1A:
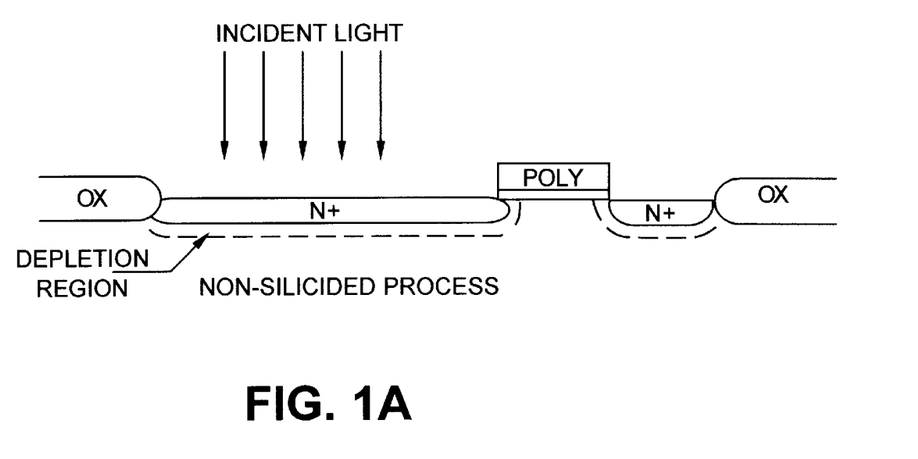
FIGS. 1A and 1B illustrate different prior art photodetecting structures.

A key component of all imaging systems is the photodetector, a device used to detect incident photons of visible light that originate from an object whose image is to be captured. Some prior art detection devices include those illustrated in FIGS. 1A and 1B. FIG. 1A illustrates a conventional technique for realizing a photodiode having a p-type doped substrate and a heavily doped N+ diffusion layer forming a p-n junction. The p-n junction is surrounded by an insulating oxide region. The N+ can be the source/drain diffusion of an adjacent transistor with the p-substrate being electrically contacted if necessary through conventional means.

Most photodiodes operate based on the principle of reverse-biasing a p-n junction diode such that a depletion region is formed. Next, the photodiode is subjected to incident light as shown which travels through the transparent oxide layers and into the silicon. The properties of the semiconductor are such that electron-hole pairs are generated both inside and outside the depletion region in response to the incident photons of visible light. These photogenerated electron-hole pairs are then swept away by diffusion and drift mechanisms and collected in the depletion region, thereby inducing a photocurrent representing a portion of the desired image.

A significant factor contributing to the sensitivity of a photodiode is its ability to capture as many incident photons as possible. In the example of FIG. 1A, virtually the entire N+ surface region above the depletion region is exposed, such that the incident photons can enter the structure through the large N+ region.

Integrated circuits built using modern and future generation fabrication processes are placing severe constraints on the design, implementation and performance of photodetecting structures. For example, modern integrated circuits such as image sensor ICs often attempt to incorporate a large number of photodetecting elements into the single IC die to meet limited physical space requirements. To meet such a challenge, the N+ region of the conventional photodiode in FIG. 1A must be made considerably smaller, thereby reducing the sensitivity of the photodiode structure.

Moreover, as the total power dissipated by an IC keeps increasing due to increasing complexity of the functions desired to be implemented, semiconductor fabrication processes keep up by allowing ever shrinking dimensions for the constituent circuit elements. Shrinking dimensions and larger numbers of interconnects, however, present increased resistances across the entire IC. For example, field effect transistor (FET) devices built using advanced CMOS processes have such small lateral and vertical dimensions that the resistance presented by the highly doped diffusion regions at the source and drain, as well as the polysilicon layer of the gate, become too high for effective signal transmission. To alleviate this problem, modern CMOS fabrication processes of the polysilicon self-aligned type provide the additional process step of covering the exposed silicon areas of the source, drain, and gate with a high conductivity material known as a silicide so as to present lower sheet resistance to the subsequently formed metal contacts. The silicide layer may be formed by applying a layer of metal such as titanium over the exposed silicon, and then causing a reaction between the titanium and silicon to transform the metal layer into a silicide.

In a self-aligned CMOS ("salicided") process, silicide strapping covers the entire N+ region of the source and drain in FIG. 1A. Because the silicide is virtually an opaque material, although up to 10% of light can get through at the thickness used in CMOS processes, the photodiode in FIG. 1A can rely only on incident photons which reach the depletion region from an angle. As a result, image arrays using photodiodes as in FIG. 1A are less effective in capturing an image when built on a CMOS salicided process.

One way to increase the number of photons that reach the p-n junction of FIG. 1A is to customize the silicide by adding process steps to further pattern the silicide, such that no silicide is formed over those regions used for photodetection. However, such an additional step will be time consuming and will increase manufacturing costs when the IC is mass produced.

Figure 1B:
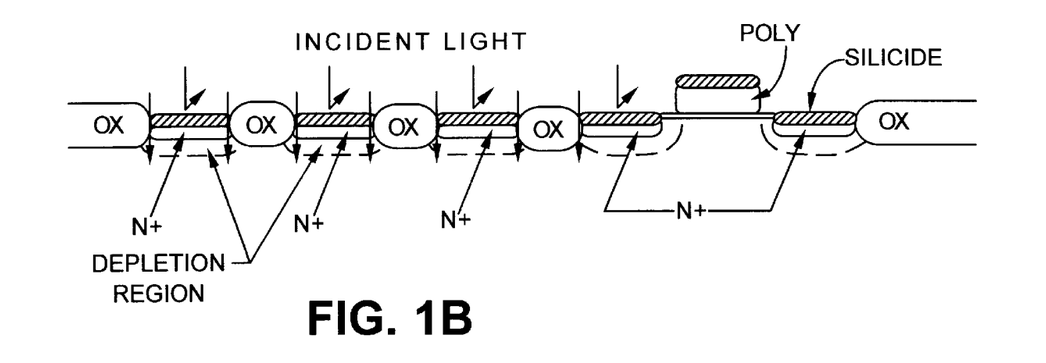

Another way to increase the photon count appears in FIG. 1B as a series of "edge-intensive" photodiodes, where the incident light enters the photodiode through multiple translucent oxide regions surrounding an interdigitated silicide structure. Such a scheme renders a less effective photodiode as compared to the conventional non-salicided design in FIG. 1A as less photons are captured per unit area.

Finally, another disadvantage of the photodiode structures in FIGS. 1A and 1B is that they will require customized fabrication steps, especially with modern and future processes. That is because as transistor dimensions continue to shrink with advanced fabrication processes, the diffusion region depths for the source and drain of a field effect transistor (FET) must also shrink to permit the proper design of short channel FETs. As the diffusion depths shrink, the optical properties of photodiodes built using such diffusion-substrate junctions also change. Thus, to maintain the original optical properties, a different diffusion region will need to be built solely for photodiodes. This addition to the standard diffusion regions used for the FETs undesirably increases process complexity. Therefore, there is a need for a photodiode structure that can be implemented using standard IC fabrication processes but which also allows for flexibility in defining the optical properties.

SUMMARY

The invention is directed at a novel photodiode having a p-n junction defined between a well and a substrate layer. The photodiode's photosensitive region is defined in and around the p-n junction of the well and the substrate, the well being formed in the substrate.

DRAWINGS

The elements of the invention set forth above and other aspects and advantages of the invention will be better understood with regard to the following description, appended claims, and accompanying drawings where:

DETAILED DESCRIPTION

Figure 2A:
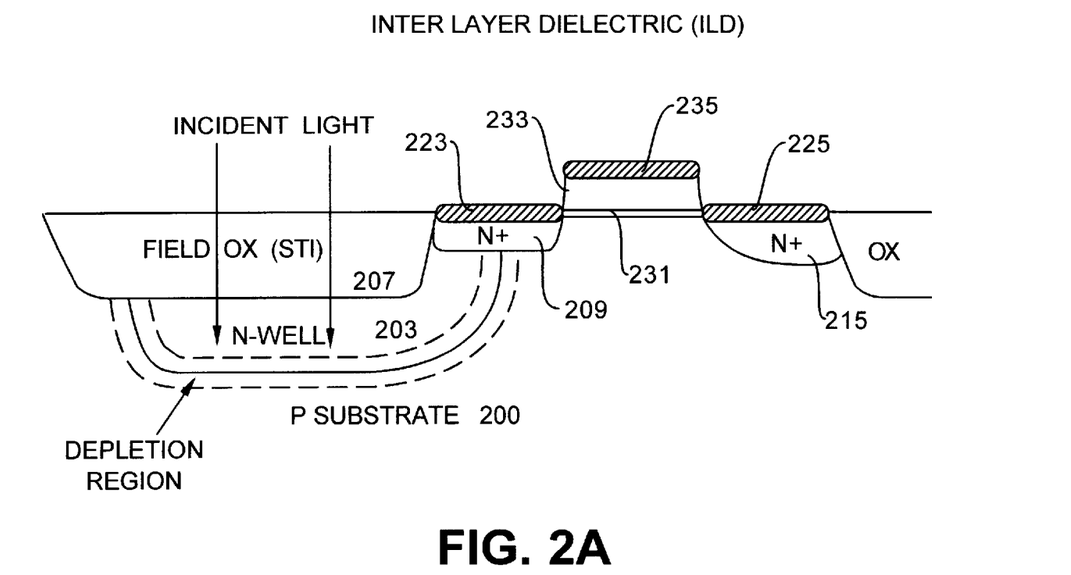
FIGS. 2A and 2B show a cross-section of a semiconductor structure containing the invention according to first and second embodiments, respectively.
Figure 2B:
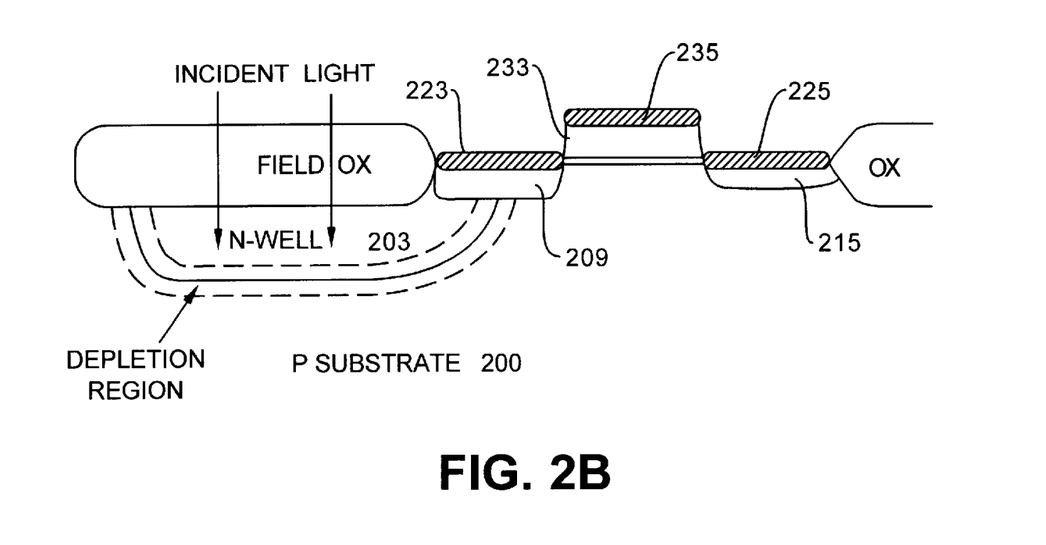

FIGS. 2A and 2B illustrate semiconductor structures implemented in a modern silicon CMOS fabrication process that contain first and second embodiments of the photodiode of the invention, respectively. The photodiode in each of FIGS. 2A and 2B features a photosensitive p-n region formed by a substrate 200 and a well 203 sitting in the substrate. The well 203 is typically formed by ion implantation of the substrate 200. The insulating field oxide 207 substantially covers the well 203, except for a small highly-doped diffusion region 209 for making electrical contact with the well. The substrate 200 may also be electrically contacted using well known techniques (not shown). Other techniques known to those skilled in the art are also available for making electrical contact with the well and substrate.

The photodiode is effectively created between ground, a common node having electrical contact with the substrate, and the diffusion region 209. In one particular embodiment of the invention, the substrate 200 has p-type conductivity and well 203 has n-type conductivity. For this scenario, the diffusion region 209 would be heavily doped as an N+ diffusion region to make ohmic contact to the well 203. Alternatively, the p-n junction can be formed between a n-substrate and a p-well, with a P+ diffusion region for contacting the well 203. Other different substrate and well combinations are possible and within the capabilities of those reasonably skilled in CMOS integrated circuit design. In all cases, however, a diode depletion region is formed across and near the p-n junction between the well 203 and the substrate 200. After applying the correct reverse bias voltage to the resulting photodiode, a photocurrent can then be induced in response to the transmitted incident light.

FIG. 2A shows the invention as used with a space efficient topology in a modern CMOS fabrication process. The field oxide 207 is thus represented by a shallow trench isolation (STI). FIG. 2B shows an alternate embodiment where the field oxide can be of the Local Oxidation of Silicon (LOCOS) type. The structure of FIG. 2B remains otherwise identical to the structure of FIG. 2A described above. In both cases, however, it should be noted that the photodiode exists beneath the field oxide. Thus, the oxide (either STI or LOCOS) is not being used for electrically isolating the photodiode in a lateral direction. This contrasts with the conventional structures in FIGS. 1A and 1B where the oxide layer plays a lateral isolation role for the photodiodes. The photodiode of the invention effectively receives lateral electrical isolation in part from the high doping of the substrate.

The remaining features of FIGS. 2A and 2B define a FET structure having gate conducting layer 235. The FET acts as a conventional reset transistor for the photodiode, as shown by the FET with gate M3 receiving a Reset signal in an exemplary photocell circuit 600 in the schematic of FIG. 6. The FET also features a drain/source conducting layer 225 formed over a drain/source diffusion 215, and a gate having oxide 231 covered by polysilicon 233 and conducting gate layer 235. Diffusion 209 is covered by conducting layer 223 and plays the role of both source for the FET and ohmic contact to the photodiode's well 203. The conducting layers are typically formed by depositing a layer of refractory metal over the silicon and then alloying the metal on the silicon surface using known techniques to form the silicide. For example, the refractory metal can be one of cobalt, titanium, tungsten, tantalum, and molybdenum.

The silicides are virtually opaque and therefore reflect virtually all incident optical signals. However, the field oxide (typically silicon dioxide) is substantially transparent to the incident optical signals of interest, i.e., those that can be detected by the photosensitive region, and therefore allows a significant number of photons to enter the photodiode. The photosensitive region is defined as that portion of the well 203 and substrate 200 where electron-hole pairs are generated in response to transmitted light. This includes a depletion region at and around the p-n junction defined between the well and the substrate, as well areas inside the well and substrate but lying outside the depletion region.

The optical properties of the invention's photodiode can be adjusted to a certain degree without any significant effects on the performance of a FET formed in another substantially identical well region on the same IC. This can be done by, for example, varying the depth of the well 203 and keeping the width of the diffusion regions 209 and 215 constant. In this way, the invention's photodiode structure can keep abreast of advanced fabrication processes which call for increasingly shallower diffusion regions.

Figure 3:
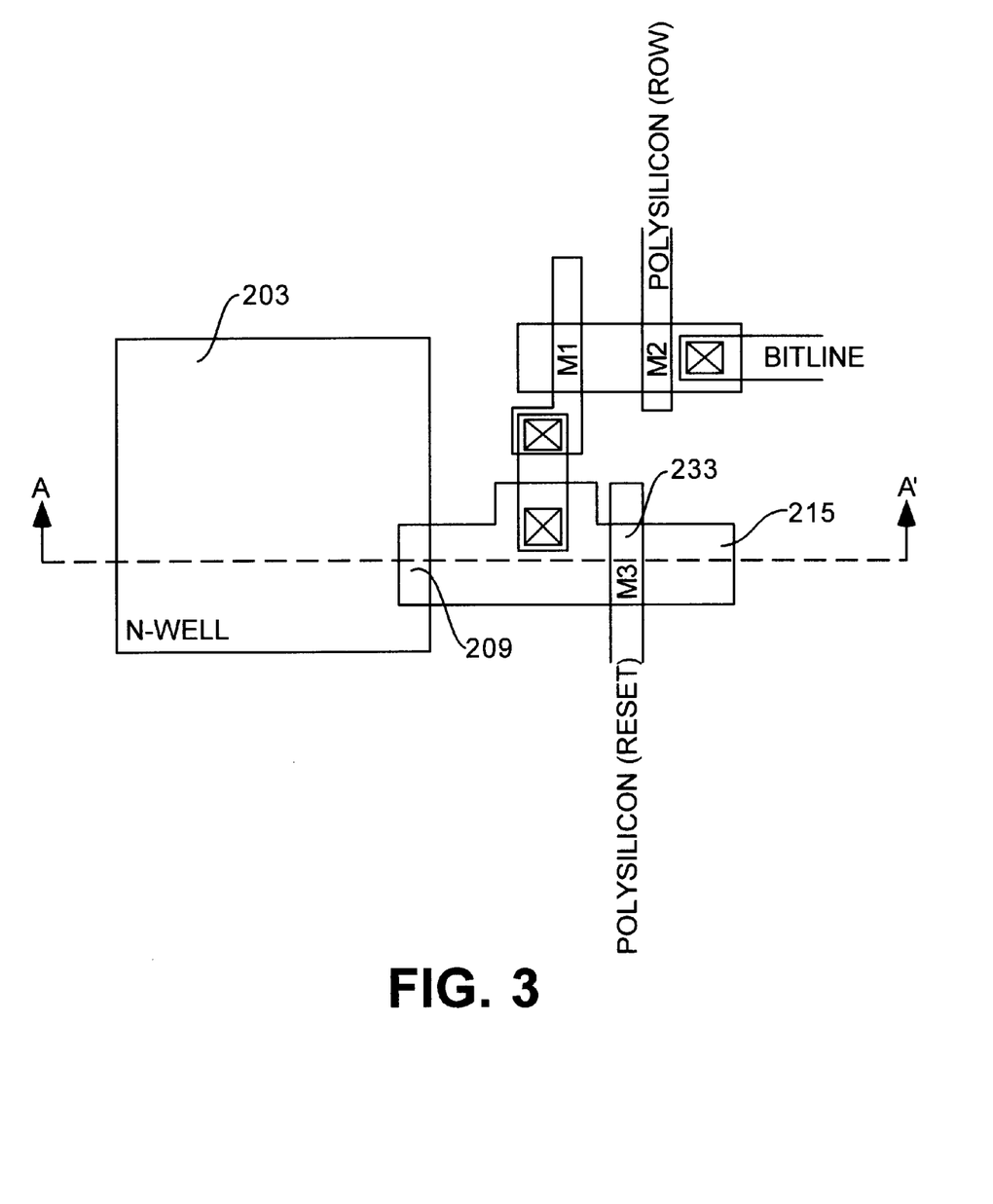
FIG. 3 is a layout of a photocell containing a photodiode according to the first and second embodiments of the invention.

FIG. 3 is an exemplary layout of a CMOS photocell that incorporates the invention. The plane cut by the line A–A' defines a cross-section of a portion of the photocell, the portion being illustrated by earlier FIGS. 2A and 2B. The invention's photodiode is represented in the layout as n-well 203 with N+ diffusion 209. The size (area) of the photodiode as defined by the well 203 boundary is typically maximized in relation to the area of the photocell. The adjacent field effect transistor (FET) has gate 233, and drain 215 connected to supply voltage $V_{DD}$.

Figure 4A:
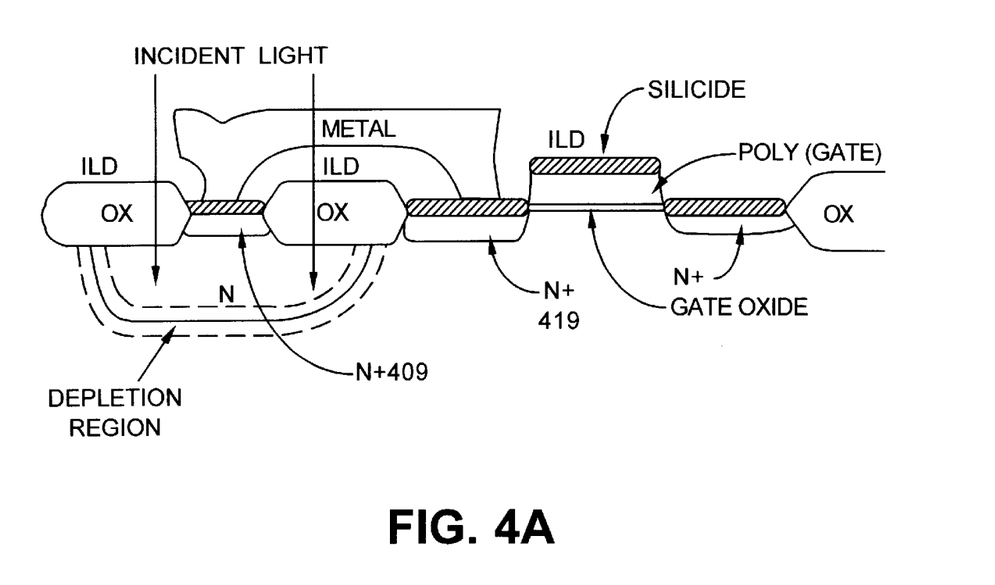
FIGS. 4A and 4B illustrate a cross-section of a semiconductor structure containing the invention according to third and fourth embodiments, respectively.
Figure 4B:
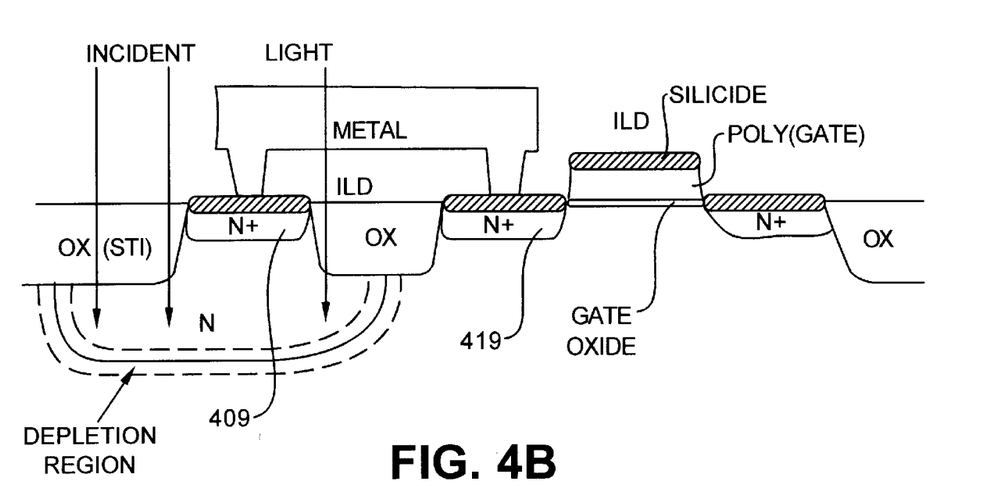
Figure 5:
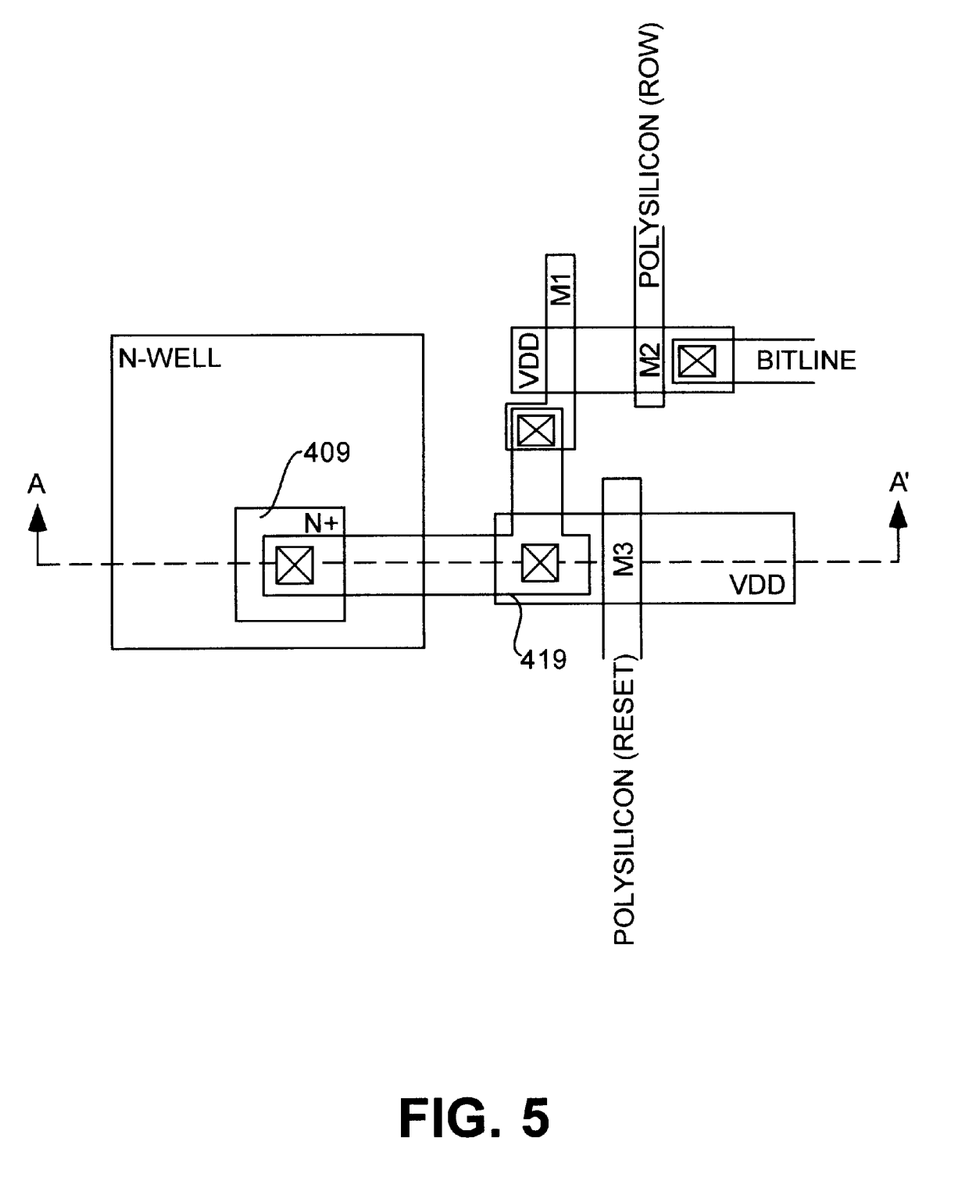
FIG. 5 is a layout of a photocell according to the third and fourth embodiments of the invention.

FIGS. 4A and 4B illustrate alternative third and fourth embodiments of the invention, where a metal line connects the well N+ diffusion 409 of the photodiode to a separate source N+ diffusion 419 for the adjacent reset FET. The structures in FIGS. 4A and 4B remain otherwise identical to those in FIGS. 2A and 2B described above, with FIG. 4A showing an STI oxide and FIG. 4B having a LOCOS oxide. FIG. 5 is a layout of a photocell featuring the structure in either FIGS. 4A or 4B. The plane cut along lines A–A' defines a cross-section of a portion of the photocell illustrated in FIGS. 4A and 4B.

Figure 6:
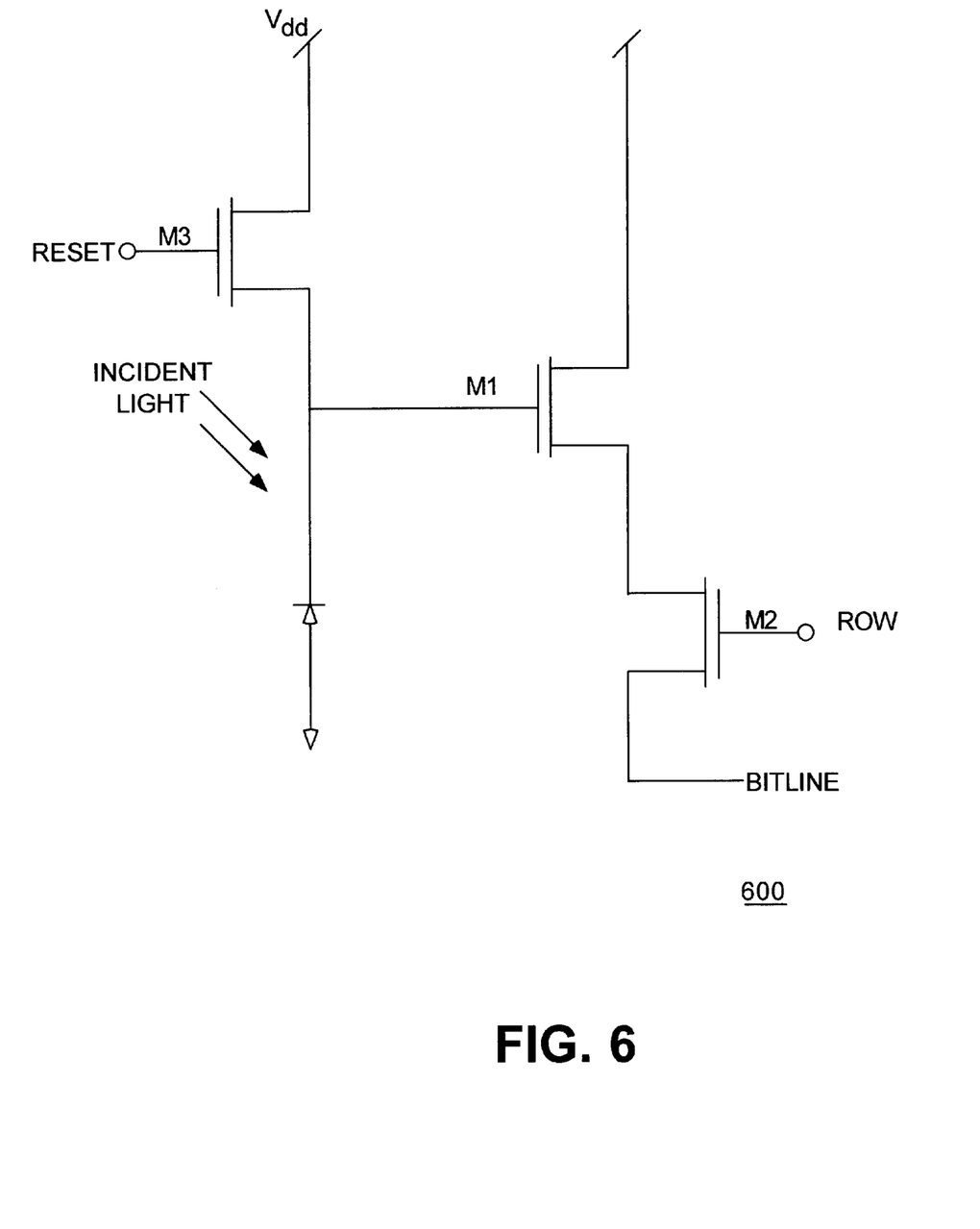
FIG. 6 is an equivalent circuit of an exemplary photocell.

FIG. 6 is a schematic of photocell circuit 600 based upon the layouts of FIGS. 3 and 5, showing the metal strips M1, M2, and M3 as connections to the respective gates of three FETs in the photocell. The Reset, Row, and Bitline terminals are also shown, as well as the connections to the positive supply node $V_{DD}$. Reset circuitry includes the FET with metal strip M3, whereas the readout circuitry features FETs with metal strips M1 and M2. Photocell circuit 600 includes a photodiode having an n-well in a p-substrate, the n-well connected to gate metal M1 and the source of FET with gate metal M3, and the p-substrate connected to ground. The operation of the photocell circuit 600 will be readily apparent to one skilled in the art of CMOS image sensing circuitry.

Figure 7:
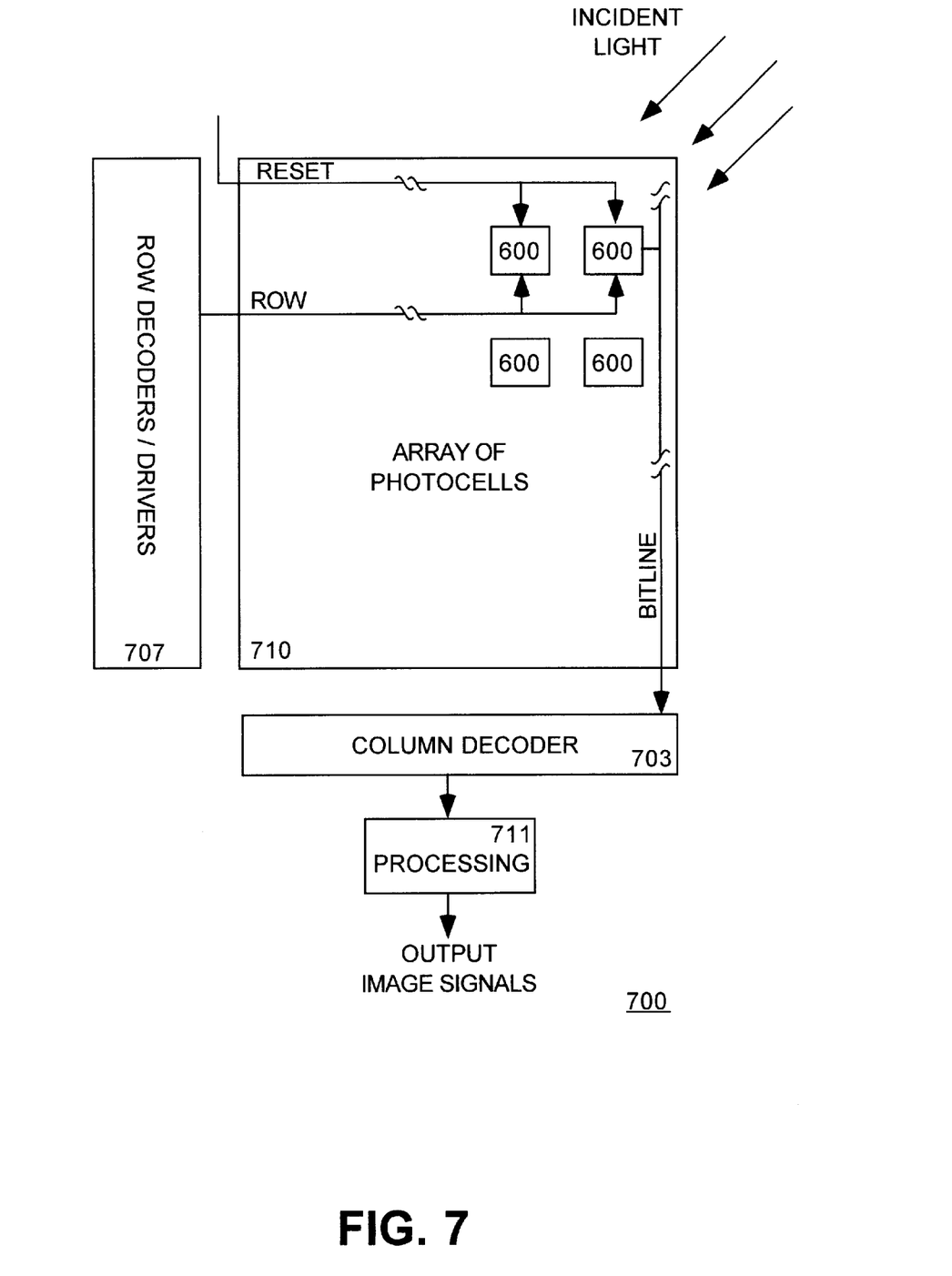
FIG. 7 illustrates a block diagram of an exemplary image sensor circuit.

The photodiode invention may be utilized as part of an image sensor IC, a portion of which is shown in FIG. 7. The sensor IC 700 includes an array of photocell circuits 600 interfacing row decoder/drivers 707 and column decoder 703. Signals that represent the image are output by the processing block 711 which may include analog signal conditioning circuitry to deliver analog image signals. Alternatively, the exemplary sensor IC 700 may also include on-board A/D converters coupled to the analog output of each photocell, and digital signal processing circuitry in the processing block 711 for digital manipulation of the photocell signals to yield digital image signals. Also, in that case, the A/D conversion may occur before or after the column decoder 703.

Figure 8:
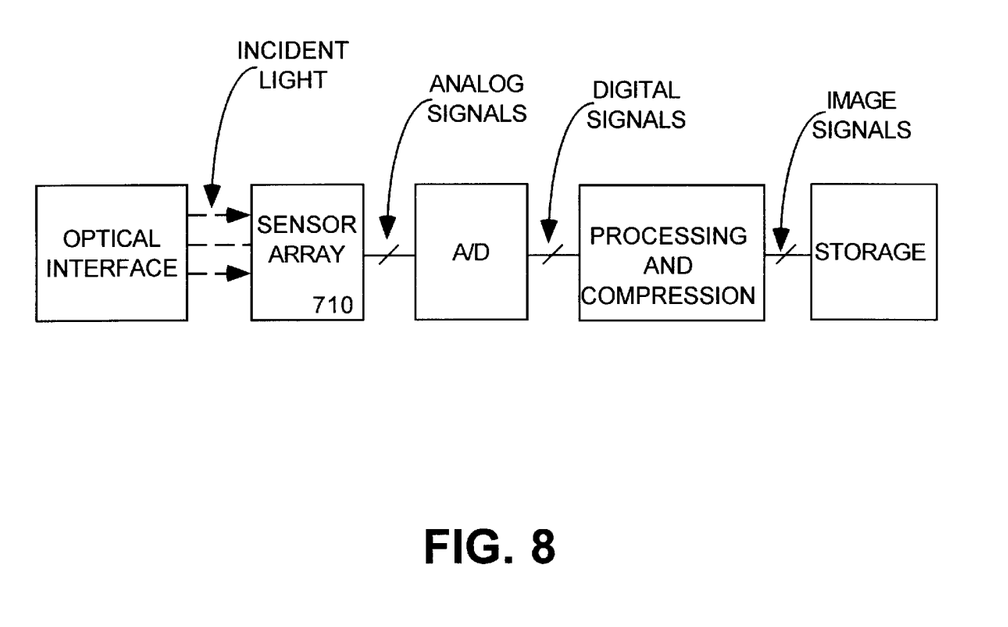
FIG. 8 is a block diagram of an image capture system incorporating the invention.

The sensor IC 700 can be incorporated into an image capture system such as a digital camera. FIG. 8 shows such an embodiment including sensor array 710 coupled to an optical interface and an A/D conversion block.

To summarize, a well-to-substrate photodiode is disclosed. The photodiode structure can be implemented using standard CMOS fabrication processes without requiring separately engineered diffusion regions, and therefore presents a cost efficient and flexible solution to the problem of integrating an image sensor array into digital ICs. The embodiments of the photodiode device described above for exemplary purposes are, of course, subject to other variations in structure and implementation within the capabilities of one reasonably skilled in the art. Thus, the details above should be interpreted as illustrative and not in a limiting sense.

What is claimed is:

1. A photodiode for converting incident optical signals into electrical signals, comprising:

substrate layer of semiconductor material of a first conductivity type;

well of semiconductor material of a second conductivity type having a top and bottom, the bottom of the well being disposed in the substrate and a p-n junction defined there between, the well and substrate defining a photosensitive region of said photodiode;

tap region of semiconductor material of the second conductivity type in contact with the well, the tap region having a greater dopant concentration than the well to promote electrical contact with the well; and a field oxide region covering a substantial portion of the top of the well, the oxide region permitting the passage of at least some of the incident optical signals into the photosensitive region.

2. The photodiode of claim 1 wherein the substrate layer and well comprise the semiconductor material silicon.

3. The photodiode of claim 1 further comprising a metal electrical contact connected to the tap region.

4. The photodiode of claim 1 wherein the photodiode is formed by a salicided process and wherein a metal electrical contact is formed by depositing a layer of refractory metal over the tap region and then causing a reaction between the layer of refractory metal and the tap region.

5. The photodiode of claim 1 wherein the first conductivity type is p-type, and the second conductivity type is n-type.

6. The photodiode of claim 1 wherein the first conductivity type is n-type, and the second conductivity type is p-type.

7. The photodiode of claim 1 wherein the oxide region is a shallow trench isolation region formed by a CMOS fabrication process.

8. The photodiode of claim 1 wherein the oxide region is a LOCOS oxide.

9. A photocell electrically responsive to incident light, comprising:

a photodiode having a p-n junction between a substrate of a first conductivity type and a well region of a second conductivity type, the well and substrate defining a photosensitive region of said photodiode, the well region being formed in the substrate and having a top substantially covered by a field oxide region being substantially transparent so that incident light can be detected by the photosensitive region, and a tap region of semiconductor material of the second conductivity type in contact with the well, the tap region having a greater dopant concentration than the well to promote electrical contact with the well; and reset circuitry coupled to the photodiode for initializing the photodiode in preparation for detecting incident light; and readout circuitry coupled to the photodiode for reading an electrical signal representative of detected light.

10. The photocell of claim 11 wherein the reset circuitry comprises a MOS FET formed in the substrate adjacent to the photodiode, the MOS FET configured as a switch for applying and removing a reverse bias to the photodiode.

11. The photocell of claim 10 wherein the tap region is an extension of a source/drain diffusion of the MOS FET.

12. An image sensor IC comprising:

a plurality of photocells arranged in rows and columns, each photocell having a well-to-substrate photodiode and associated reset and readout circuitry, a well of said photodiode having a top being substantially covered by a field oxide region, and a tap region of semiconductor material of the second conductivity type in contact with the well, the tap region having a greater dopant concentration than the well to promote electrical contact with the well;

a plurality of row decoder/drivers coupled to the photocells for generating a row select signal for a row of photocells; and a column decoder coupled to the photocells for decoding a column of photocells.

13. The image sensor IC of claim 12, further comprising an A/D converter coupled to at least one of said plurality of photocells; and digital signal processing circuitry coupled to the AID converter.

14. An image capturing system, comprising:

optical interface exposed to incident light;

sensor array of photocells electrically responsive to the incident light, each photocell having a well-to-substrate photodiode and associated reset and readout circuitry, a well of said photodiode having a top being substantially covered by a field oxide region, and a tap region of semiconductor material of the second conductivity type in contact with the well, the tap region having a greater dopant concentration than the well to promote electrical contact with the well;

A/D conversion unit coupled to the sensor array;

digital signal processing unit coupled to the A/D conversion unit for processing and compressing digital data received from the A/D conversion unit to yield a detected image; and storage unit coupled to the digital signal processing unit for storing the detected image.

15. The photodiode of claim 1 further comprising dielectric layer formed above the field oxide region and being substantially transparent to the incident optical signals.

16. A photodiode for converting incident light into electrical signals, comprising:

a first region of semiconductor material of a first conductivity type;

a second region of semiconductor material of a second conductivity type in contact with the first region; a p-n junction of the photodiode of defined between the first and second regions, the first and second regions defining a photosensitive region of said photodiode; a third region of semiconductor material of the second conductivity type in contact with the second region, the third region having a greater dopant concentration than the second region to facilitate electrical contact with the second region; and a field oxide region covering a substantial portion of a top of the second region and receiving the incident light, the oxide region permitting passage of at least some of the incident light into the photosensitive region.

17. The photodiode of claim 1 wherein the well is sufficiently large to allow formation therein of one or more transistors which can be built using the same process used for manufacturing the photodiode.

18. The photocell of claim 9 wherein the well is sufficiently large to allow formation therein of one or more transistors which can be built using the same process used for manufacturing the photocell.

19. The image sensor IC of claim 12 wherein the well is sufficiently large to allow formation therein of one or more transistors which can be built using the same process used for manufacturing the image sensor IC.

20. The image capturing system of claim 14 wherein the well is sufficiently large to allow formation therein of one or more transistors which can be built using the same process used for manufacturing the sensor array.

21. The photodiode of claim 16 wherein the first region includes a substrate, the second region includes a well disposed in the substrate, and the third region is built as part of a transistor drain/source junction formation step in a MOS fabrication process.

22. The photodiode of claim 21 further comprising a trench oxide isolation region covering a substantial portion of a top of the well and that permits passage of all of substantially the incident light that is detected by the photodiode into the photosensitive region.

23. The photodiode of claim 16 wherein the second region has a dopant concentration that is suitable as a background for building transistors therein using the same process used for manufacturing the photodiode.

* * * * *

UNITED STATES PATENT AND TRADEMARK OFFICE
CERTIFICATE OF CORRECTION

PATENT NO. : 6,040,592　　　　　　　　　　　　　　　　　　　　　　　　Page 1 of 1
DATED : March 21, 2000
INVENTOR(S) : McDaniel et al.

It is certified that error appears in the above-identified patent and that said Letters Patent is hereby corrected as shown below:

Column 6,
Line 20, delete "11" and replace with -- 9 --.

Signed and Sealed this

Fourteenth Day of May, 2002

Attest:

Attesting Officer

JAMES E. ROGAN
Director of the United States Patent and Trademark Office